United States Patent
Hino et al.

[11] Patent Number: 5,377,172
[45] Date of Patent: Dec. 27, 1994

[54] MODULATED MAGNETIC FIELD GENERATION CIRCUIT FOR MAGNETO-OPTICAL DISKS

[75] Inventors: Yasumori Hino, Neyagawa; Norio Miyatake, Kobe, both of Japan

[73] Assignee: Matsushita Electric Industrial Co., Ltd., Osaka, Japan

[21] Appl. No.: 69,155

[22] Filed: May 28, 1993

[30] Foreign Application Priority Data

May 29, 1992 [JP] Japan .................... 4-138360

[51] Int. Cl.⁵ .................................... G11B 11/10
[52] U.S. Cl. ............................... 369/13; 360/114
[58] Field of Search ............ 369/13; 360/114, 46, 360/123, 125, 59

[56] References Cited

U.S. PATENT DOCUMENTS

| | | | |
|---|---|---|---|
| 4,937,802 | 6/1990 | Omori et al. | 369/13 |
| 4,979,158 | 12/1990 | Yoda | 369/13 |
| 5,020,041 | 5/1991 | Nakao et al. | 369/13 |
| 5,157,641 | 10/1992 | Lehureau | 360/114 |
| 5,189,567 | 2/1993 | Mody | 369/13 |
| 5,199,010 | 3/1993 | Adachi et al. | 360/114 |
| 5,220,467 | 6/1993 | Zucker | 369/13 |
| 5,229,902 | 7/1993 | Zucker et al. | 369/13 |

FOREIGN PATENT DOCUMENTS

| | | | |
|---|---|---|---|
| 0312143 | 4/1989 | European Pat. Off. | 369/13 |
| 60-48806 | 10/1985 | Japan . | |

Primary Examiner—Robert J. Pascal
Assistant Examiner—Tan Dinh
Attorney, Agent, or Firm—Ratner & Prestia

[57] ABSTRACT

A modulated magnetic field generation circuit is used in a disk recording apparatus which can overwrite data on a magneto-optical disk. The modulated magnetic field generation circuit includes a first coil for applying the magnetic field modulated for recording to the magneto-optical disk, a second coil for storing the energy used to reverse the direction of the current flowing to the first coil, a current limiter for limiting the current flowing to the second coil, and switching elements for changing the direction of the current flowing to the second coil to the first coil. Thus, a high frequency modulated magnetic field is generated with low power consumption and low voltage.

8 Claims, 5 Drawing Sheets

MODULATED MAGNETIC FIELD GENERATION CIRCUIT FOR MAGNETO-OPTICAL DISKS

BACKGROUND OF THE INVENTION

1. Field of the Invention

The present invention relates to a modulated magnetic field generation circuit used in magnetic field modulation method magneto-optical memory apparatuses

2. Description of the Prior Art

Various data overwriting methods have been proposed to increase the data recording speed of magneto-optical memory apparatuses. One of these methods is the magnetic field modulation method (JP-B-60-48806). Data is recorded in this magnetic field modulation method by modulating the magnetic field applied from an external source according to the data being recorded. The magnetized direction of the recording film in the area heated by laser beam irradiation is modified, and data is recorded. The external magnetic field is generated using a magnetic head comprising a coil and core, or using a floating magnetic head (U.S. Pat. No. 5,020,041). A magnetic field modulation circuit having a constant current switching circuit is used to modulate the external magnetic field generated by the magnetic head according to the data. This magnetic field modulation circuit functions to change the current direction through the coil of the magnetic head, and composes two or four transistors or other switching devices.

Several problems are presented by this conventional magnetic field modulation circuit. When a switching operation is effected to change the direction of the magnetic head current, the current through the magnetic head will be changed with a delay determined by a time constant R/L (where L is the coil inductance and R is the DC resistance). Thus, it has been difficult to obtain a high frequency change of the electric current direction at the magnetic head.

Two methods have been used to decrease the current reversing time (A) reducing the magnetic head inductance, or (B) increasing the DC resistance of the magnetic head.

It is difficult to use method (A), however, because it is necessary to apply a magnetic field of sufficient strength to the magneto-optical storage medium. With method (B), it is necessary to increase the power supply voltage, and circuit power consumption becomes extremely high. These factors make it extremely difficult to reduce the size and power consumption of magneto-optical disk apparatuses using the magnetic field modulation method.

SUMMARY OF THE INVENTION

Therefore, an object of the present invention is to provide a circuit capable of driving a high inductance magnetic head with a low power supply voltage, low power consumption, at a high frequency.

To achieve this object, a modulated magnetic field generation circuit according to the present invention comprises a first coil for applying the magnetic field modulated for recording to the magneto-optical recording medium, a second coil for storing the energy used to reverse the direction of the current through the first coil, a constant current supply for limiting the current through the second coil, and a means for switching the direction of the current through the first coil.

Using a circuit composition as described above, the energy used for reverse the direction of the current through the first coil is stored in the second coil because the current supplied to the first coil passes through the second coil. When the connection of the first coil is reversed by the switching element or other direction control means from this state, the energy stored in the second coil works in the direction reversing the current flowing to the first coil. Because of this action, the time required to reverse the direction of the current flowing to the first coil is faster than the normal time constant R/L of the first coil. As a result, the high frequency modulated magnetic field can be generated using a smaller power supply and less power consumption.

BRIEF DESCRIPTION OF THE DRAWINGS

The present invention will become more fully understood from the detailed description given below and the accompanying diagrams wherein.

DESCRIPTION OF PREFERRED EMBODIMENTS

The first embodiment of a modulated magnetic field generation circuit according to the invention is described below with reference to FIG. 1.

Figure 1:
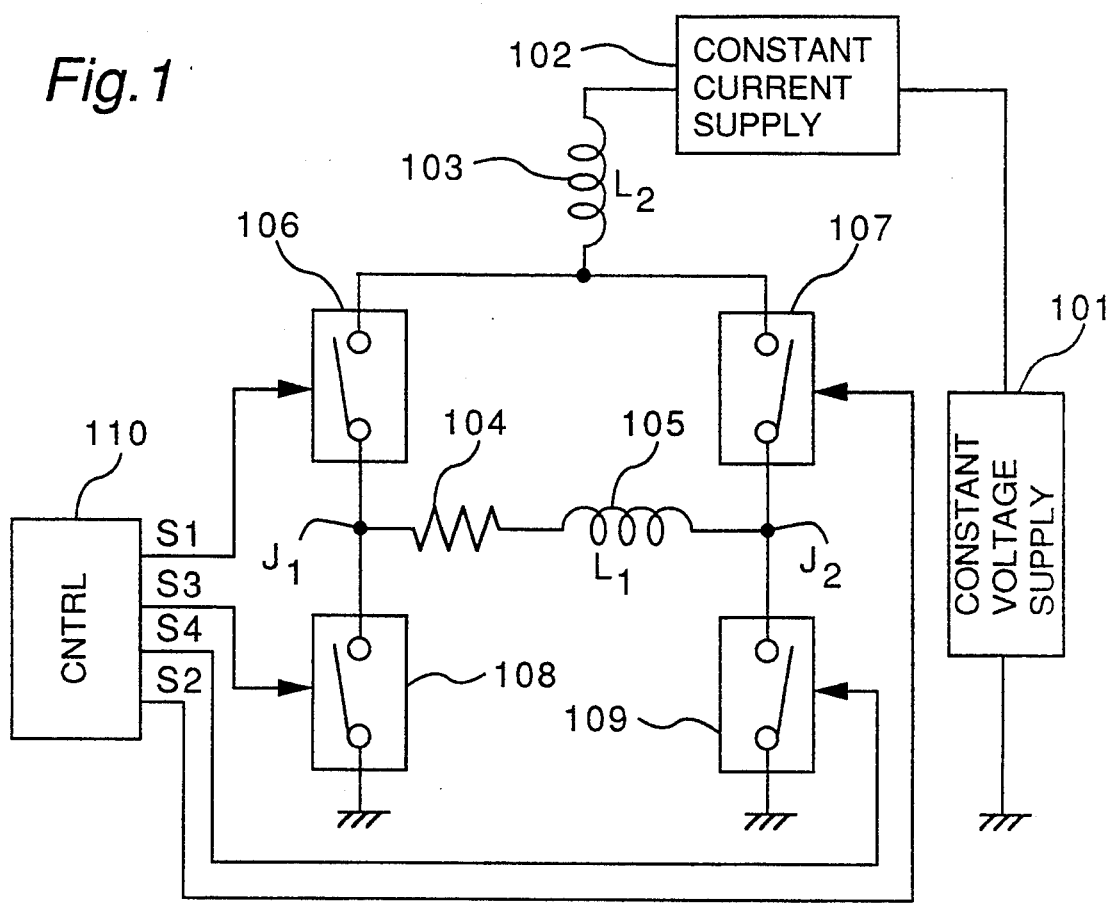
FIG. 1 is a block diagram of a modulated magnetic field generation circuit according to the first embodiment of the invention.

As shown in FIG. 1, this modulated magnetic field generation circuit comprises a magnetic head coil 105 having an inductance L1 of about 9.5-$\mu$H, a constant voltage power supply 101 supplying a voltage to the magnetic head coil 105, a constant current supply 102 of current $I_s$, a coil 103 having an inductance L2 of about 100-$\mu$H for storing the energy needed to reverse the current through the magnetic head coil 105, a DC resistor 104 connected in series to the magnetic head coil 105, switching elements 106, 107, 108 and 109 controlling the direction of the current through the magnetic head coil 105, and a controller 110 for controlling the ON and OFF operations of the switching elements. The controller 110 produces switching signals along lines S1, S2, S3 and S4 for controlling ON and OFF operations of switching elements 106, 107, 108 and 109, respectively, wherein signals on lines S1 and S2 are the same and the signals on lines S3 and S4 are the same but in opposite phase to those on lines S1 and S2. Switching elements 106 and 108 are connected in series between coil 103 and the ground, and switching elements 107 and 109 are also connected in series between coil 103 and the ground. Resistor 104 and magnetic head coil 105 are connected in series between a junction J1 between switching elements 106 and 108 and a junction J2 between switching elements 107 and 109.

The operation of the modulated magnetic field generation circuit thus comprised is described below.

When the signals from controller 110 turns switching elements 106 and 109 ON and switching elements 107 and 108 OFF, the current $I_s$ flows from the constant voltage power supply 101 to the constant current supply 102, the coil 103, switching element 106, the resistor 104, the magnetic head coil 105, and switching element 109. During the current flow, the coil 103 stores energy and, at the same time, the magnetic head coil 105 excites a magnetic field proportional to the current $I_s$ to record data on a disk. As apparent to those skilled in the art, the magnetic field is applied from one side surface of the disk and the laser is applied from anther side surface to heat the area where the magnetic field is applied. Thus, the heated area is polarized in a direction determined by the applied magnetic field to effect the recording.

Figure 6:
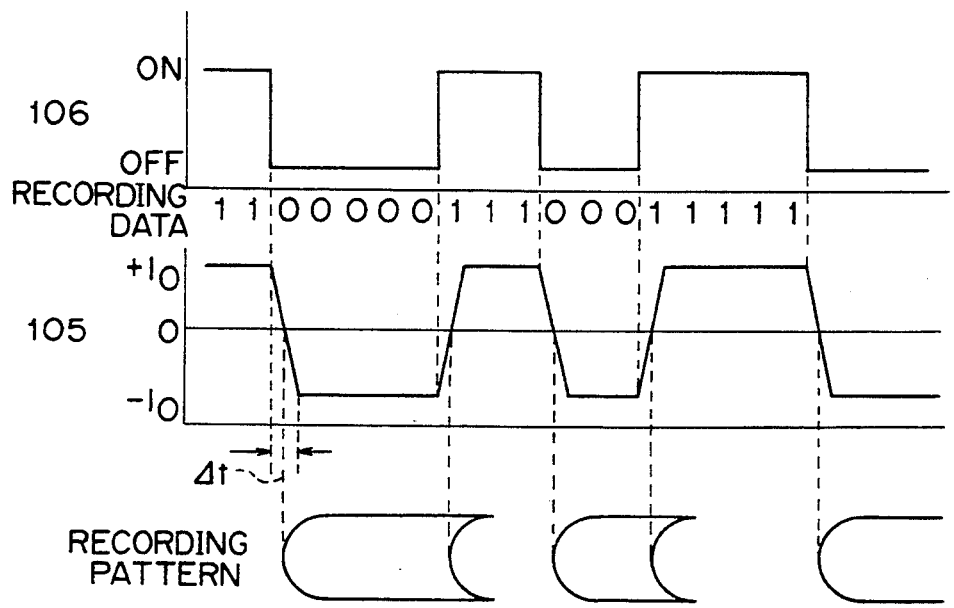
FIG. 6 is a graph shown waveforms of the input signal and the current flowing through the magnetic head coil.

When the signals from controller 110 are changed to turn switching elements 107 and 108 ON and switching elements 106 and 109 OFF, the current path is changed and the current flows from the coil 103 to switching element 107, the magnetic head coil 105, passes the resistor 104, and flows through switching element 108. In response to the change of the switching position, the counter electromotive force in coil 105 is produced to suppress current flow from junction J2 to J1. However, because the energy stored in coil 103 is emitted, the counter electromotive force of coil 105 is counteracted by the current from coil 103. In other words, a current added with a supplementary current by the emission of the energy accumulated in a previous cycle flows through the coil 105. Thus, the current flowing through the magnetic head coil 105 is rapidly reversed in a very short response time $\Delta t$, such as several 10s nanoseconds, as shown in FIG. 6. The magnetic head current is rapidly reversed because the 100-$\mu$H inductance of the coil 103 is sufficiently greater than the inductance of the magnetic head coil 105.

Figure 7:
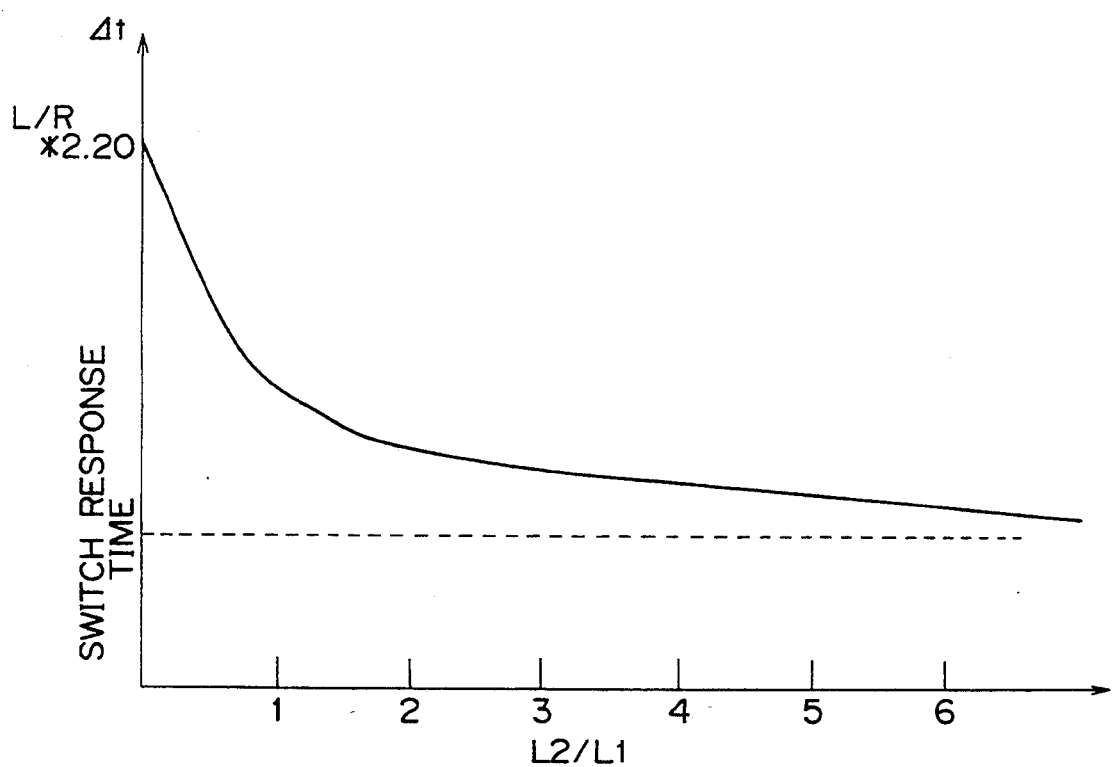
FIG. 7 is a graph showing a relationship between the response time and the inductance ratio.

As shown in FIG. 6, the signal applied, e.g., to switching element 106 is a pulse duration modulation signal. The switching element 106, as well as other switching elements, responds to the signal in a very short time, such as 20 nanoseconds, as shown by dotted line in FIG. 7. As shown in the graph of FIG. 7, the response time $\Delta t$ becomes small as the ratio L2/L1 of inductance of coil 103 to coil 105 becomes greater. According to the present invention, such a ratio L2/L1 should be greater than 1 and preferably greater than 2.

In the first embodiment, the current reversing time when a 9.5-$\mu$H inductance magnetic head coil 105 is driven with a ±170 mA drive current is 80 nanoseconds. In usual magnetic field modulator to achieve the same 80-ns current reversing time driving an identical magnetic head coil with the identical ±170 mA drive current, the DC current resistance of the magnetic head coil must be 261 $\Omega$ and the power supply voltage must be 44.4 V, resulting in power consumption of 7.5 W. The power supply voltage of the modulated magnetic field generation circuit according to this embodiment, however, is only 5 V and power consumption is only 0.85 W, a significant reduction in both characteristics.

A modulated magnetic field generation circuit according to the second embodiment of the invention is described below with reference to FIG. 2.

Figure 2:
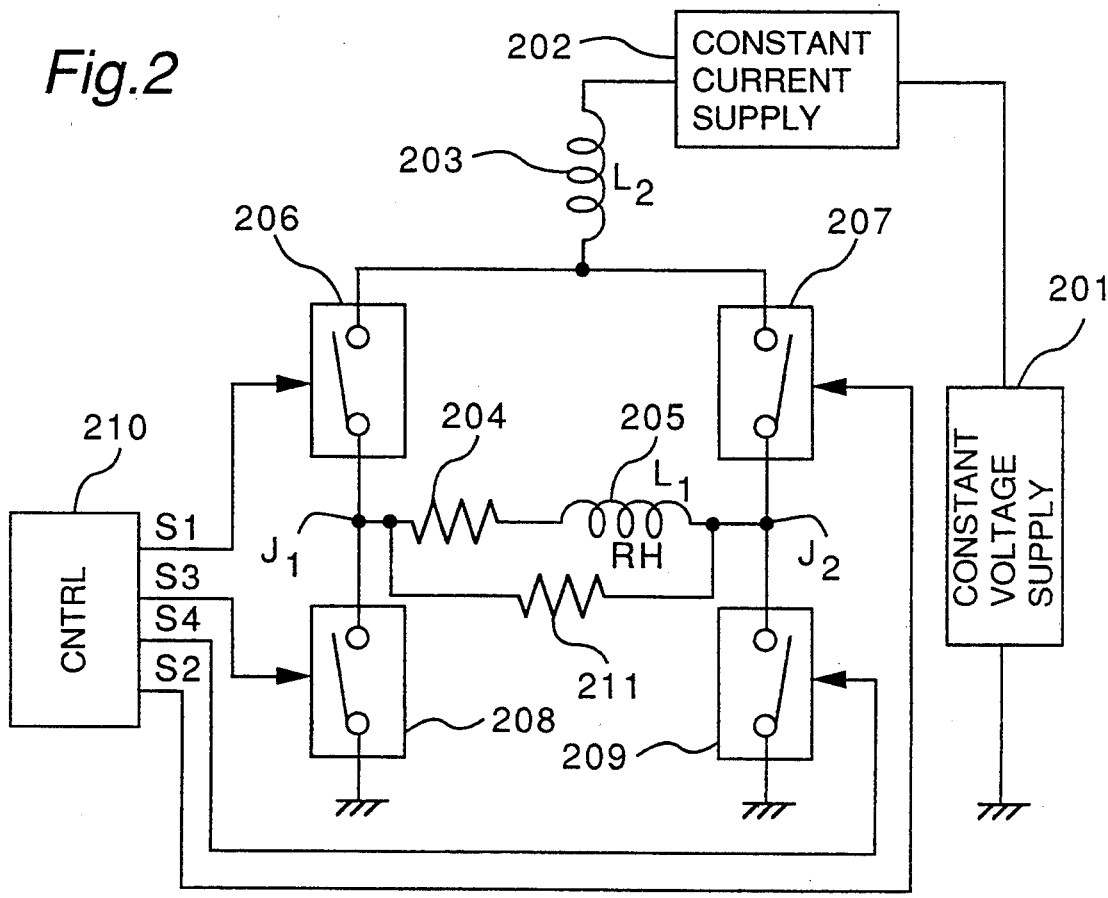
FIG. 2 is a block diagram of a modulated magnetic field generation circuit according to the second embodiment of the invention.

As shown in FIG. 2, this modulated magnetic field generation circuit comprises a magnetic head coil 205 having an inductance L1 of about 9.5-$\mu$H, a constant voltage power supply 201 applying a voltage to the magnetic head coil 205, a constant current supply 202 of current $I_s$, a coil 203 having an inductance of about 100-$\mu$H for storing the energy needed to reverse the current of the magnetic head coil 205, a DC resistor 204 connected in series to the magnetic head coil 205, switching elements 206, 207, 208 and 209 controlling the direction of the current through the magnetic head coil 205, a controller 210 for controlling the ON and OFF operations of the switching elements, and a damping resistor 211 having a resistance $R_H$ for limiting the current reversing time of the magnetic head coil 205.

There will be virtually no wrong effect on the recording characteristics if the current reversing time is faster than the time required for the laser beam to travel 0.2 $\mu$m on the medium. It is therefore meaningless to increase the current reversing time faster than the time required for the laser beam to travel 0.2 $\mu$m on the medium. In the first embodiment described above, however, the current reversing time of the magnetic head coil 105 is essentially determined by the switching time of the switching elements 106–109, and it is difficult to change the current reversing time. In addition, the voltage Vt=L1×di/dt, which is determined by the inductance L1 of the modulated magnetic head coil 105 and the current reversing time, is applied to the switching elements 106–109 when the current is reversed. As a result, if the current reversing time cannot be adjusted, the current reversing time becomes faster than necessary, and switching elements with a greater voltage resistance than is necessary must be used for the switching elements 106–109. To avoid this problem in the second embodiment, a damping resistor 211 with resistance $R_H$ is inserted parallel to the magnetic head coil 205 and DC resistor 204. This damping resistor 211 functions to bias the current variation component that is faster than necessary, making it simple to adjust the current reversing time of the modulated magnetic head coil 205 by changing the resistance $R_H$ of this damping resistor 211.

Figure 5:
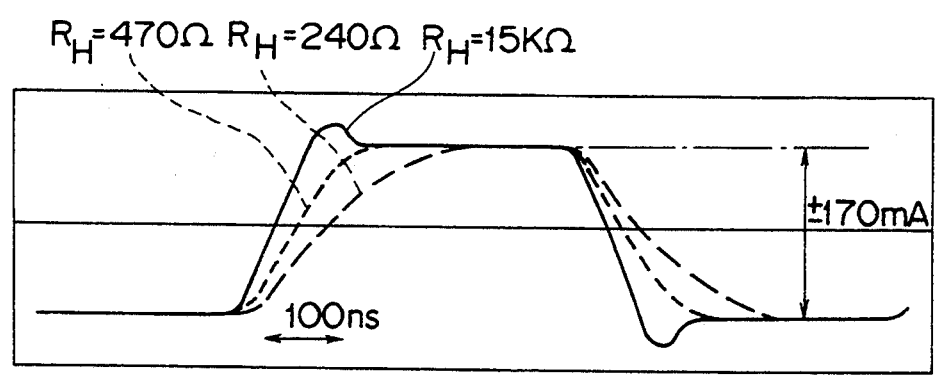
FIG. 5 is a current wave form resulting from the damping resistance of the second embodiment.

The current wave form when the resistance $R_H$ is changed is shown in FIG. 5. The current reversing time can be freely controlled by adjusting the resistance $R_H$. It is to be noted that while the damping resistance $R_H$ is provided parallel to the magnetic head coil 205 in this embodiment, the momentary voltage occurring at current reversal can be limited and the same net effect obtained with the damping resistance $R_H$ inserted parallel to the reversing energy storage coil 203.

A modulated magnetic field generation circuit according to the third embodiment of the invention is described below with reference to FIG. 3.

Figure 3:
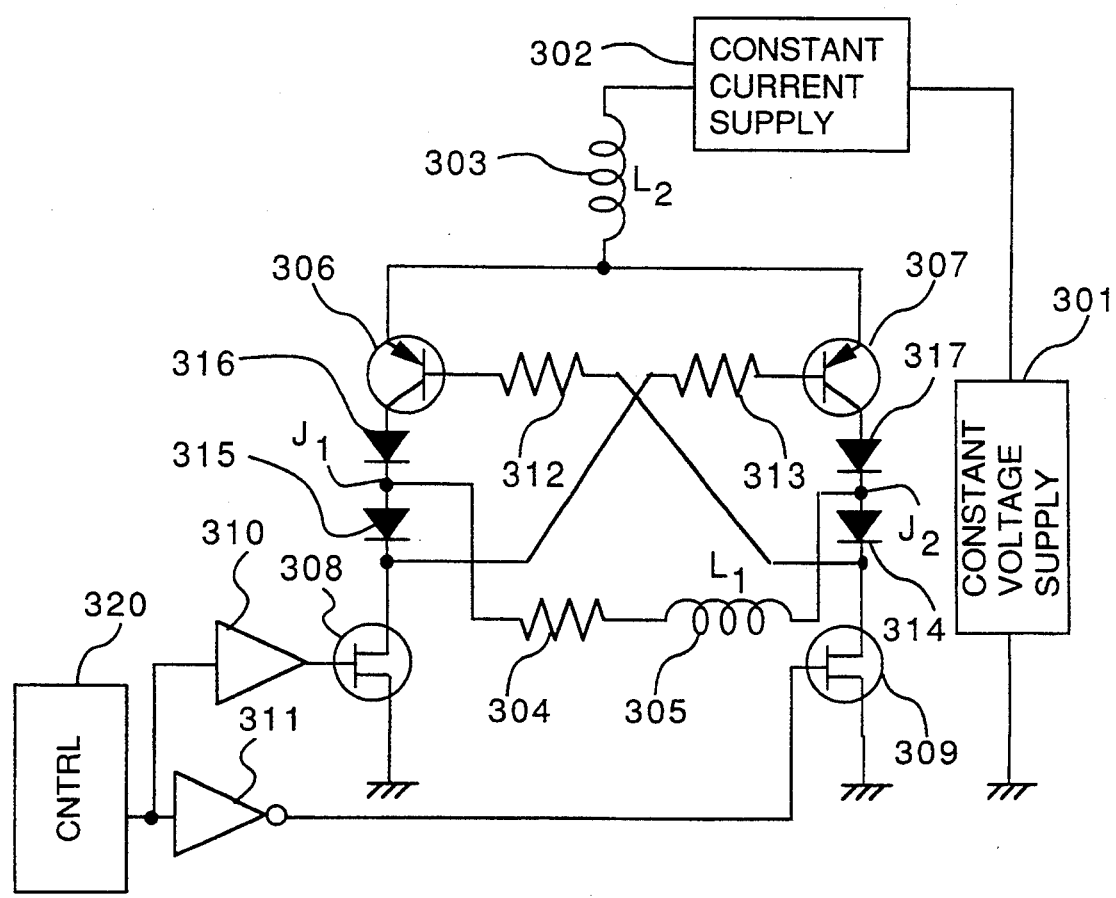
FIG. 3 is a block diagram of a modulated magnetic field generation circuit according to the third embodiment of the invention.

As shown in FIG. 3, the modulated magnetic field generation circuit comprises a magnetic head coil 305 having an inductance of about 9.5-$\mu$H, a constant voltage power supply 301 applying a voltage to the magnetic head coil 305, a constant current supply 302 of current $I_s$, a coil 303 having an inductance of about 100-$\mu$H for storing the energy needed to reverse the current of the magnetic head coil 305, a DC resistor 304 for the magnetic head coil 305, transistor switches 306 and 307, field effect transistor switches 308 and 309, a controller 320 for producing driving signal, drivers 310 and 311 for driving the field effect transistor switches 308 and 309 in opposite phase, resistors 312 and 313 for limiting the base current of the transistor switches 306 and 307, diodes 314 and 315 for restricting the direction of the base current, and protector diodes 316 and 317 for protecting the transistor switches 306 and 307.

A modulated magnetic field generation circuit comprised according to this third embodiment operates as follows.

In the first and second embodiments above the four switching elements must be individually controlled, and the construction of the controller is accordingly more complex. In addition, because an L1×di/dt voltage is applied to switching elements 106 and 107 (206 and 207 in the second embodiment) during current reversal, the driver must be insulated with a photocoupler or other device. To resolve this problem in the third embodiment, switching elements 306 and 307 are switched on/off by corresponding switching elements 309 and 308, respectively. Specifically, when switching element 309 becomes ON by a HIGH level signal from inverter 311, the base current is supplied to transistor 306 through resistor 312, turning the transistor 306 ON. When switching element 309 becomes OFF, the base current supply to transistor 306 is cut off, thus turning the transistor 306 off. Because the other transistor switching element 307 is operated in the same way, the controller 320 can control transistor switching element 306 and 307 operation by controlling the corresponding switching elements 308 and 309, and the construction can be simplified.

Diodes 316 and 317 are also inserted to protect the transistor switches 306 and 307 from the reverse voltage applied to the collectors of the transistors 306 and 307 when the on/off operation of the transistors 306 and 307 is delayed by the carrier accumulation effect of the base.

A modulated magnetic field generation circuit according to the fourth embodiment of the invention is described below with reference to FIG. 4.

Figure 4:
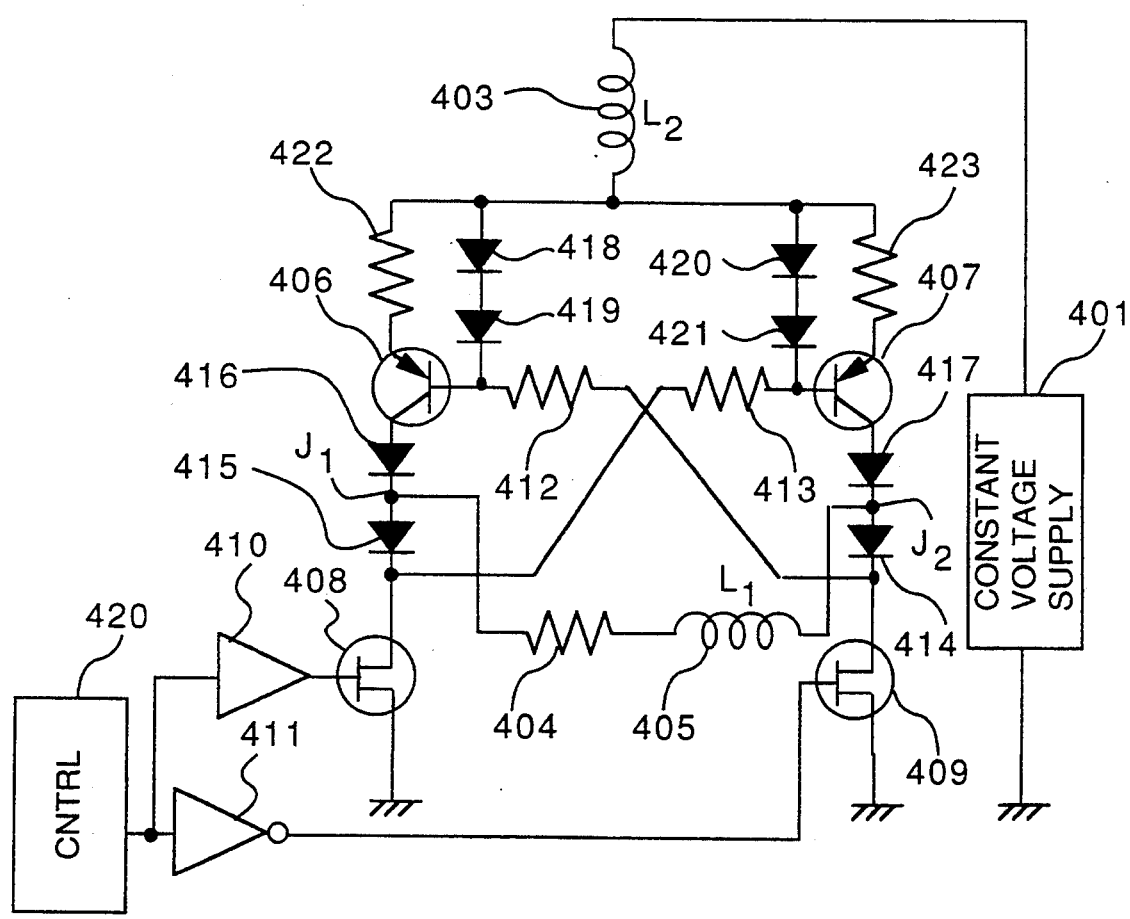
FIG. 4 is a block diagram of a modulated magnetic field generation circuit according to the fourth embodiment of the invention.

As shown in FIG. 4, this modulated magnetic field generation circuit comprises a magnetic head coil 405 having an inductance of about 9.6-$\mu$H, a constant voltage power supply 401 applying a voltage to the magnetic head coil 405, a coil 403 having an inductance of about 100-$\mu$H for storing the energy needed to reverse the current of the magnetic head coil 405, a DC resistor 404 for the magnetic head coil 405, transistor switches 406 and 407, field effect transistor switches 408 and 409, a controller 420 for producing driving signal, drivers 410 and 411 for driving the field effect transistor switches 408 and 409, resistors 412 and 413 for limiting the base current of the transistor switches 406 and 407, diodes 414 and 415 for restricting the direction of the base current, protector diodes 416 and 417 for protecting the transistor switches 406 and 407, diodes 418, 419, 420 and 421 for applying a bias voltage to the transistor switches 406 and 407, and resistors 422 and 423 for limiting the emitter current of the transistor switches 406 and 407.

Note that this embodiment differs from the third embodiment described above in that the constant current supply 302 is eliminated and instead diodes 418–421 are provided for supplying constant currents.

A modulated magnetic field generation circuit comprised according to this fourth embodiment operates as follows.

When switching element 409 is OFF, current does not flow to transistor 406. When this switching element 409 becomes ON, a bias voltage $V_B$ is applied to the transistor 406 by two diodes 418 and 419, and current flows to the transistor 406. The current value $I_E$ at this time is defined as $I_E = (V_B - V_{BE})/R_E$ where $V_{BE}$ is the base-emitter voltage of the transistor 406 and $R_E$ is the resistance of resistor 412. This also applies to the other transistor switch 407. In effect, a function limiting the current flowing to the magnetic head coil 405 is added to the transistor switches 406 and 407.

Transistors with a low carrier accumulation effect must be used for the transistors 306 and 307 in the third embodiment and the maximum operating frequency is limited because the transistor switches 306 and 307 operate in a saturated state. In the fourth embodiment, however, the transistors 406 and 407 do not operate in a saturated state, and operation at a higher frequency is possible.

It is to be noted that a 100-$\mu$m inductance coil is used for the coil storing the energy needed to reverse the magnetic head current in the above embodiments, but any inductance greater than the inductance of the magnetic head coil will offset the energy of the magnetic head coil during current reversing, and is sufficiently effective.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

WHAT IS CLAIMED IS:

1. A modulated magnetic field generation circuit comprising:
    a first coil for producing a magnetic field for recording in response to a current flowing therethrough;
    first switching circuit means for providing a constant current to said first coil in a first direction;
    second switching circuit means for providing a constant current to said first coil in a second direction;
    a second coil connected to said first and second switching circuit means for storing an energy used to reverse the direction of the current flowing to the first coil; and
    control means for controlling said first and second switching circuit means.

2. A modulated magnetic field generation circuit comprising:
    first and second switching means connected in series;
    third and fourth switching means connected in series;
    power supply means connected to said first and third switching means;
    first coil means for producing a magnetic field for recording in response to a current flowing therethrough, said first coil connected between a first junction between said first and second switching means and a second junction between said third and fourth switching means;
    second coil means for accumulating energy therein, said second coil means connected in series to said power supply means; and
    control means for controlling said first and fourth switching means to turn on simultaneously, and said second and third switching means to turn on simultaneously, alternately, whereby when said first and fourth switching means are on, a current added with a supplementary current by the emission of an energy accumulated in a previous cycle flows through said first coil in one direction and, at the same time, accumulating energy in said second coil means, and when said second and third switching means are on, a current added with a supplementary current by the emission of the accumulated energy flows through said first coil in opposite direction and, at the same time accumulating energy in said second coil means.

3. A modulated magnetic field generation circuit as claimed in claim 2, further comprising a resistor connected parallel to said first coil means.

4. A modulated magnetic field generation circuit as claimed in claim 1, wherein a ratio of inductance of said second to first coil means is greater than 2.

5. A modulated magnetic field generation circuit comprising:
   a first coil for producing a magnetic field for recording in response to a current flowing therethrough;
   first and fourth switching means for providing a constant current to said first coil in a first direction where said first switching means is a switching transistor and said fourth switching means is a field effect transistor;
   second and third switching means for providing a constant current to said first coil in a second direction wherein said third switching means is a switching transistor and said second switching means is a field effect transistor;
   a second coil connected to said first and third switching means for storing an energy used to reverse the direction of the current flowing to the first coil;
   control means for controlling said first, second, third and fourth switching means; and
   first and second diodes connected in series between said first and second switching means and third and fourth diodes connected in series between said third and fourth switching means, said first coil means connected between a junction between said first and second diodes and a junction between said third and fourth diodes.

6. A modulated magnetic field generation circuit comprising:
   a first coil for producing a magnetic field for recording in response to a current flowing therethrough;
   first and fourth switching means for providing a constant current to said first coil in a first direction where said first switching means is a switching transistor and said fourth switching means is a field effect transistor;
   second and third switching means for providing a constant current to said first coil in a second direction wherein said third switching means is a switching transistor and said second switching means is a field effect transistor;
   a second coil connected to said first and third switching means for storing an energy used to reverse the direction of the current flowing to the first coil;
   control means for controlling said first, second, third and fourth switching means; and
   first and second diodes connected in series between said first and second switching means and third and fourth diodes connected in series between said third and fourth switching means, said first coil means connected between a junction between said first and second diodes and a junction between said third and fourth diodes;
   said first switching means having a base connected to a junction between said fourth diode and said fourth switching means, and said third switching means having a base connected to a junction between said second diode and said second switching means.

7. A modulated magnetic field generation circuit comprising:
   a first coil for producing a magnetic field for recording in response to a current flowing therethrough;
   first and fourth switching means for providing a constant current to said first coil in a first direction where said first and fourth switching means are switching transistor;
   second and third switching means for providing a constant current to said first coil in a second direction wherein said third and second means are switching transistors;
   a second coil connected to said first and third switching means for storing an energy used to reverse the direction of the current flowing to the first coil;
   control means for controlling said first, second, third and fourth switching means; and
   a power supply means including a constant current supply means comprising a first diode means connected between a base and an emitter of said first switching means and a second diode means connected between a base and an emitter of said third switching means.

8. A modulated magnetic field generation circuit as claimed in claim 2, further comprising first and second diodes connected in series between said first and second switching means and third and fourth diodes connected in series between said third and fourth switching means, said first coil means connected between a junction between said first and second diodes, and a junction between said third and fourth diodes.

* * * * *

UNITED STATES PATENT AND TRADEMARK OFFICE
CERTIFICATE OF CORRECTION

PATENT NO.   :   5,377,172
DATED        :   December 27, 1994
INVENTOR(S)  :   Hino et al.

It is certified that error appears in the above-identified patent and that said Letters Patent is hereby corrected as shown below:

Column 7, line 22, the word "wherein" should be --where--.

Column 8, line 26, the word "transistor" should be --transistors--.

Column 8, line 29, the word "wherein" should be --where--.

Signed and Sealed this

Twenty-fifth Day of April, 1995

Attest:

BRUCE LEHMAN

*Attesting Officer*     *Commissioner of Patents and Trademarks*